US007175508B2

United States Patent
Izumi

(10) Patent No.: US 7,175,508 B2
(45) Date of Patent: Feb. 13, 2007

(54) POLISHING APPARATUS, METHOD OF MANUFACTURING SEMICONDUCTOR DEVICE USING THE SAME, AND SEMICONDUCTOR DEVICE MANUFACTURED BY THIS METHOD

(75) Inventor: Shigeto Izumi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/290,815

(22) Filed: Dec. 1, 2005

(65) Prior Publication Data
US 2006/0148384 A1 Jul. 6, 2006

Related U.S. Application Data

(63) Continuation of application No. PCT/JP2004/007899, filed on Jun. 1, 2004.

(30) Foreign Application Priority Data
Jun. 3, 2003 (JP) .............................. 2003-158072

(51) Int. Cl.
*B24B 7/02* (2006.01)
(52) U.S. Cl. ...................... 451/41; 451/285; 451/287; 451/398
(58) Field of Classification Search .................. 451/41, 451/285–289, 388, 398, 24
See application file for complete search history.

(56) References Cited

U.S. PATENT DOCUMENTS 5,476,414 A * 12/1995 Hirose et al. ............... 451/288
5,681,215 A * 10/1997 Sherwood et al. .......... 451/388
5,913,714 A * 6/1999 Volodarsky et al. ........... 451/41
5,938,884 A * 8/1999 Hoshizaki et al. ..... 156/345.14
6,146,241 A * 11/2000 Lee et al. ...................... 451/5
6,251,215 B1   6/2001 Zuniga et al.
6,612,915 B1 * 9/2003 Uzoh et al. ................ 451/285
6,695,682 B2 * 2/2004 Sato et al. ...................... 451/8

FOREIGN PATENT DOCUMENTS

| EP | A-563954 | 4/1993 |
| EP | 0563954 | * 10/1993 |
| EP | A-1110668 | 6/2001 |
| JP | A-5-277914 | 10/1993 |
| JP | A-07-314327 | 12/1995 |
| JP | A-10-235555 | 9/1998 |
| JP | A-11-156711 | 6/1999 |
| JP | A-2001-232553 | 8/2001 |

* cited by examiner

*Primary Examiner*—Joseph J. Hail, III
*Assistant Examiner*—Robert Scruggs
(74) *Attorney, Agent, or Firm*—Morgan, Lewis & Bockius, LLP

(57) ABSTRACT

The present invention provides a polishing apparatus for a semiconductor wafer in which a slide member and a swing holding member are provided in a polishing member that is provided so as to block an opening in a head housing, a slide guide member and a ring member are provided in the head housing, the ring member surrounds the periphery of the polishing member positioned in the head housing such that a predetermined clearance is formed between the ring member and the outer peripheral portion of the polishing member, and the polishing member is constituted to be capable of a reciprocating motion using air that is supplied into and discharged from the head housing. By means of this constitution, the present invention provides a polishing apparatus in which the linearity between a polishing thrust and air pressure in the head housing is increased.

13 Claims, 9 Drawing Sheets

POLISHING APPARATUS, METHOD OF MANUFACTURING SEMICONDUCTOR DEVICE USING THE SAME, AND SEMICONDUCTOR DEVICE MANUFACTURED BY THIS METHOD

This is a continuation of PCT/JP2004/007899 filed Jun. 1, 2004, which is hereby incorporated by reference.

FIELD OF THE INVENTION

The present invention relates to a polishing apparatus for flattening the surface of a polishing subject such as a semiconductor wafer, and more particularly to the structure of a polishing head provided in the polishing apparatus. The present invention also relates to a method of manufacturing a semiconductor device using this polishing apparatus, and a semiconductor device.

BACKGROUND OF THE INVENTION

Examples of this type of polishing apparatus include a polishing apparatus in which a semiconductor wafer serving as the polishing subject is held in a holder, and the holder holding the semiconductor wafer is rotated relative to a polishing member (polishing head) while contacting the polishing member so that the surface of the semiconductor wafer is polished. With this polishing apparatus for polishing the surface of a semiconductor wafer, extremely precise and uniform polishing is required, and therefore measures such as ensuring that the polishing member changes attitude or the wafer changes attitude in accordance with surface irregularities on the wafer (polishing subject) are taken to maintain an optimum finishing condition at all times.

In a polishing apparatus disclosed in U.S. Pat. No. 6,251,215, for example, a rubber sheet having excellent flexibility is used in a head portion for holding a wafer, and air pressure is applied to the rear surface side of the rubber sheet to push the wafer against a polishing head serving as a polishing member via the rubber sheet. Further, in an apparatus disclosed in Japanese Unexamined Patent Application Publication H10-235555, a head portion holding a wafer is connected to a rotary drive shaft via a ball joint structure, and the head portion is driven to rotate in a swinging fashion via the ball joint portion. By employing structures such as the rubber sheet and ball joint described above, the head portion changes its attitude flexibly in accordance with the rotational accuracy of a surface plate to which the polishing pad is adhered and irregularities in the thickness of the polishing pad so that the wafer is in even contact with the polishing pad at all times, thus enabling uniform surface polishing.

In contrast to the constitutions described above, an apparatus which is constituted to be capable of flexibly varying the attitude of the polishing member side, or in other words the polishing pad, is also known. In this apparatus, for example, a wafer is mounted on a wafer chuck through vacuum suction such that the wafer surface to be polished faces upward (in a face-up state), and the wafer is driven to rotate together with the wafer chuck. A polishing head is provided above and facing the wafer, and the polishing head is constituted by a polishing member to which a polishing pad that contacts the wafer surface to be polished is adhered, a drive plate and a rubber sheet (diaphragm) for supporting the polishing member flexibly, and a head housing formed with an interior space which constitutes a pressure chamber for applying air pressure to the drive plate and rubber sheet. The drive plate and the outer periphery of the rubber sheet are joined at the lower end outer periphery of the head housing, and the drive plate and rubber sheet are joined to the polishing member at an inner peripheral portion. Thus the interior space of the head housing is covered by the drive plate and rubber sheet, thereby forming the pressure chamber. As a result, the polishing member is supported in the head housing via the drive plate, and receives the air pressure in the interior of the pressure chamber evenly via the rubber sheet. When the head housing is driven to rotate, a rotary driving force is transmitted to the polishing member via the drive plate so that the entire device rotates.

Wafer polishing using a polishing apparatus constituted in this manner is performed by causing the polishing pad to contact the wafer surface to be polished, which is held rotatably in the wafer chuck, while rotating the polishing pad. At this time, the polishing pad, while rotating, performs a reciprocating motion in a horizontal direction to the wafer, and thus the entire surface of the wafer is polished evenly. In a polishing apparatus employing this method, pressure is applied to the device surface (surface to be polished) of the wafer, which rotates together with the polishing head. Moreover, at this time a horizontal reciprocating motion known as a swinging motion is applied to the polishing head such that the entire device surface of the wafer can be polished evenly. Note that a polishing thrust F applied to the wafer by the polishing member (polishing pad) is expressed by Equation (1).

$$F=W+P\times S \qquad (1)$$

Here, W is the deadweight of the polishing member and so on, P is the air pressure inside the head housing (pressure chamber), and S is the pressure-receiving surface area of the polishing member.

Meanwhile, prior to the beginning of the respective polishing operations, the polishing pad is subjected to processing by a tool known as a pad conditioner (dresser) to remove approximately 2 to 3 μm of the pad material surface. This pad conditioner is structured such that a disk having granular diamonds electro-deposited onto the surface thereof is pressed against the polishing pad at a fixed pressure while being rotated, thereby polishing the surface of the polishing pad.

Hence, every time a wafer is polished, approximately 2 to 3 μm of the polishing pad is removed, and therefore, once 500 wafers have been polished, between 1 and 1.5 mm of the polishing pad surface is removed. Naturally, this removal of the polishing pad surface leads to a reduction in the thickness of the polishing pad so that a polishing pad with an initial thickness of 3 mm, for example, is reduced to a thickness between 1.5 and 2 mm after polishing 500 wafers.

When wafers are processed continuously by the polishing apparatus, the thickness of the polishing pad in use is gradually reduced due to the action of the aforementioned pad conditioner. Moreover, it is known that there is variation is the thickness of the wafers to be polished, and although approximately 775 μm is standard for a 300 mm wafer, in actual fact this varies by several tens of μm. It is also believed that the height of the polishing head of the polishing apparatus above the wafer chuck varies by approximately 0.2 mm depending on the thermal expansion coefficient of the metal constituting the apparatus. As a result of these factors, the height of the polishing member to which the polishing pad is adhered in the polishing head varies each time a wafer is processed, and accordingly, the form of a drive ring also varies each time a wafer is processed.

Note that this prior art can be found in Japanese Unexamined Patent Application Publication H11-156711, U.S. Patent Publication No. 6,251,215, and Japanese Unexamined Patent Application Publication H10-235555.

As described above, considering only variation in the thickness of the polishing pad, the maximum variation in the height of the polishing member is approximately 2 mm, and therefore the form of the drive ring varies by a maximum of approximately 2 mm. The drive ring is formed from a thin steel plate, but naturally possesses a modulus of elasticity, and the spring constant of a drive ring that is used often in the prior art, for example, is approximately 520 g/mm. Hence, when the form of the drive ring varies by 2 mm, the calculatory elastic force generated by the drive ring is (520×2=) 1040 g, and this value becomes an error in the polishing thrust F produced by pad thickness variation. Hence, when the thickness of the polishing pad decreases, the polishing thrust F is expressed as in Equation (2), where f is the elastic force generated by the drive ring.

$$F = W + P \times S - f \qquad (2)$$

Further, when the height of the polishing member varies, the rubber sheet deforms. FIGS. 10A, 10B are views showing variation in the form of a rubber sheet 503 (diaphragm) caused by raising and lowering a polishing member 501. In FIG. 10A, an area (the surface area thereof) on the inside of the vicinity of a central portion of recessed portions 504 in the rubber sheet 503 is approximated as a pressure receiving surface (pressure receiving surface area S) for receiving air pressure from the interior of a head housing 502 in the polishing member 501. Note that the polishing member 501 and rubber sheet 503 are formed in disk form, and the pressure receiving surface takes a circular form. A diameter D of the pressure receiving surface (pressure receiving surface area S) is approximated as shown in Equation (3).

$$D \cong (ID + OD)/2 \qquad (3)$$

Here, ID is the outer diameter of a contact portion between the rubber sheet 503 and polishing member 501, and OD is the inner diameter of a contact portion between the rubber sheet 503 and head housing 502.

FIG. 10B shows a case in which the polishing member 501 is lowered. In this case, the rubber sheet 503 is lifted from the polishing member 501, causing a phenomenon whereby lifted portions 505 are created in the rubber sheet 503. As a result, the outer diameter ID of the contact portion between the rubber sheet 503 and polishing member 501 changes (decreases) to ID', and the diameter D of the pressure receiving surface (pressure receiving surface area S) changes to D'. The diameter D' is approximated as shown in Equation (4).

$$D' \cong (ID' + OD)/2 \qquad (4)$$

Hence, when the height of the polishing member varies upon reception of air pressure P from within the head housing, the pressure receiving surface area S of the polishing member varies, and as a result, the linearity of the relationship between the air pressure P in the head housing and the polishing thrust F applied to the wafer by the polishing member is lost.

SUMMARY OF THE INVENTION

The present invention has been designed in consideration of these problems, and it is an object thereof to provide a polishing apparatus which reduces errors in the polishing thrust of a polishing member (polishing pad) caused by variation in the thickness of the polishing pad, and which increases the linearity between the polishing thrust and air pressure in a head housing.

Another object of the present invention is to provide a method of manufacturing a semiconductor device using this polishing apparatus, and a semiconductor device.

To achieve these objects, a first polishing apparatus according to the present invention is a polishing apparatus comprising a subject holder for holding a polishing subject and a polishing head having a polishing member provided with a polishing surface on a surface thereof which faces a surface to be polished of the polishing subject, the polishing apparatus being constituted to perform polishing of the surface to be polished by moving the polishing surface relative to the surface to be polished while the polishing surface is in contact with the surface to be polished, characterized in that the polishing head comprises a head housing having an opening in a surface thereof which faces the surface to be polished and a plate holding portion provided in the head housing for holding the polishing member, the polishing member is provided in the head housing so as to block the opening, and is constituted to be capable of a reciprocating motion in the direction of the surface to be polished using air that is supplied into and discharged from the head housing, and the plate holding portion comprises: a slide guide member provided in the head housing and extending in the direction of the surface to be polished; a slide member provided on the slide guide member so as to be capable of a reciprocating motion in the direction of the surface to be polished; and a swing holding member provided on the slide member for holding the polishing member swingably.

In this polishing apparatus, a swing buffering mechanism of the polishing member is preferably provided astride the polishing member and slide member.

In this case, a biasing spring is preferably provided in the swing buffering mechanism for urging the polishing member into a position facing the surface to be polished.

A second polishing apparatus according to the present invention is a polishing apparatus comprising a subject holder for holding a polishing subject and a polishing head having a polishing member provided with a polishing surface on a surface thereof which faces a surface to be polished of the polishing subject, the polishing apparatus being constituted to perform polishing of the surface to be polished by moving the polishing surface relative to the surface to be polished while the polishing surface is in contact with the surface to be polished, characterized in that the polishing head comprises a head housing having an opening in a surface thereof which faces the surface to be polished and a ring member provided in an inside portion of the head housing, the polishing member is provided in the head housing so as to block the opening, and is constituted to be capable of a reciprocating motion in the direction of the surface to be polished using air that is supplied into and discharged from the head housing, and the ring member is formed to surround the periphery of the polishing member positioned within the head housing such that a predetermined clearance is formed between the ring member and an outer peripheral portion of the polishing member.

In this polishing apparatus, a plate holding portion for holding the polishing member is preferably provided in the head housing, and the plate holding portion preferably comprises: a slide guide member provided in the head housing and extending in the direction of the surface to be polished; a slide member provided on the slide guide member so as to be capable of a reciprocating motion in the direction of the surface to be polished; and a swing holding member provided on the slide member for holding the polishing member swingably.

Further, a swing buffering mechanism of the polishing member is preferably provided astride the polishing member and slide member.

In this case, a biasing spring is preferably provided in the swing buffering mechanism for urging the polishing member into a position facing the surface to be polished.

In the first and second polishing apparatuses according to the present invention, constituted as described above, an intake port for supplying air into the head housing is preferably provided in the head housing, and an exhaust port for discharging air from the head housing is preferably provided in the head housing separately from the intake port.

Furthermore, it is preferable to provide an air supply pipe provided such that one end thereof is connected to the intake port; an air supply portion connected to the other end of the air supply pipe, which is capable of supplying air into the head housing via the air supply pipe and intake port; an exhaust pipe provided such that one end thereof is connected to the exhaust port; an air discharging portion connected to the other end of the exhaust pipe, which is capable of discharging air from the head housing via the exhaust port and exhaust pipe; and an air pressure control portion for controlling operations of the air supply portion and air discharging portion so that the air pressure in the head housing matches a desired air pressure.

This polishing apparatus preferably further comprises a supply side pressure measuring portion which is capable of measuring the air pressure in the air supply pipe and an exhaust side pressure measuring portion which is capable of measuring the air pressure in the exhaust pipe, and the air pressure control portion preferably measures the air pressure in the head housing on the basis of the air pressure in the air supply pipe, measured by the supply side pressure measuring portion, and the air pressure in the exhaust pipe, measured by the exhaust side pressure measuring portion, and controls operations of the air supply portion and the air discharging portion such that the measured air pressure in the head housing matches the desired air pressure.

Meanwhile, a semiconductor device manufacturing method according to the present invention is characterized in that the polishing subject is a semiconductor wafer, and comprises the step of flattening a surface of the semiconductor wafer using the polishing apparatus according to the present invention, constituted as described above.

Further, a semiconductor device according to the present invention is characterized by being manufactured by this semiconductor device manufacturing method.

DESCRIPTION OF THE PREFERRED EMBODIMENTS

Figure 1:
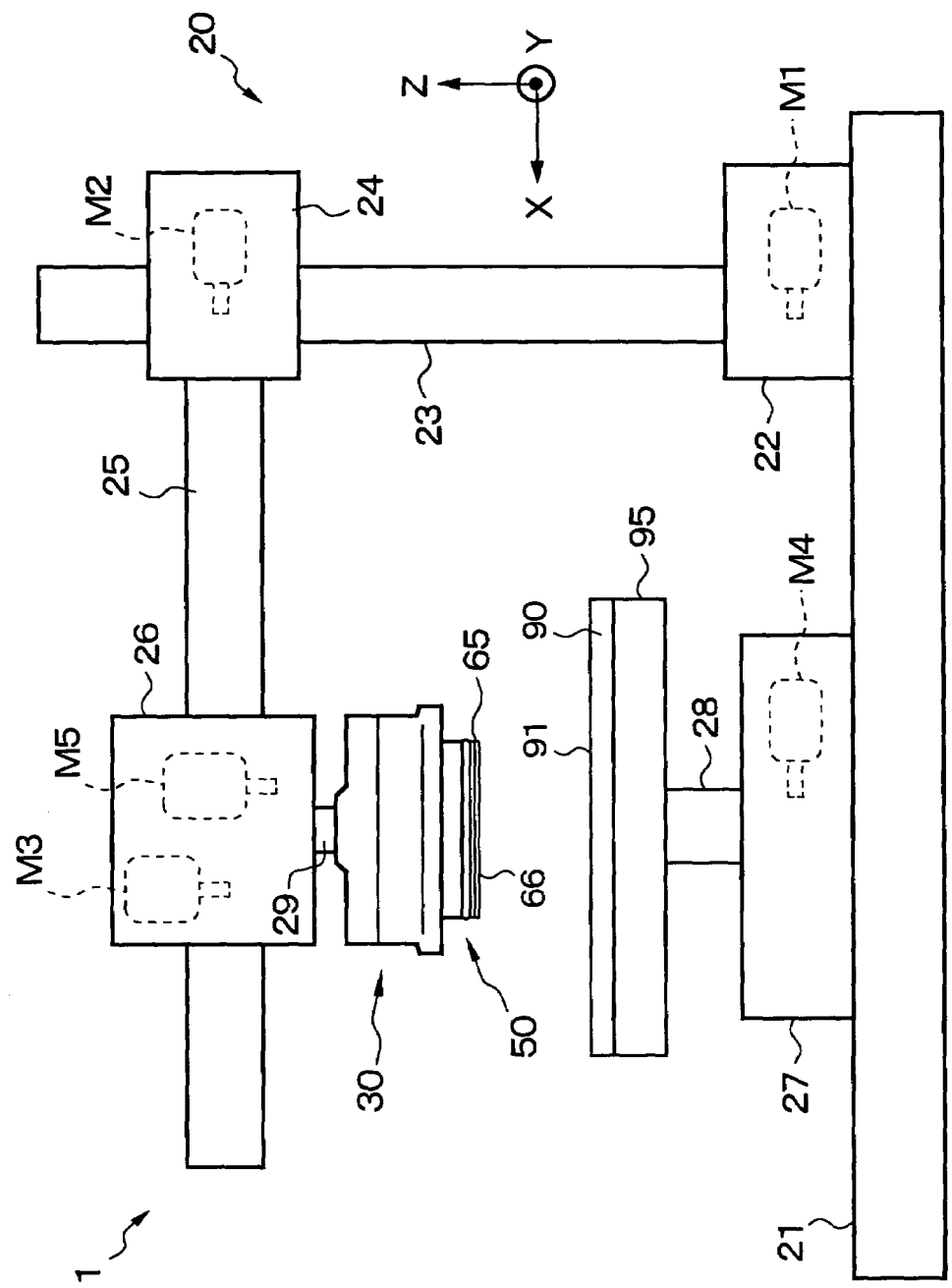
FIG. 1 is a front view of a CMP apparatus serving as an example of a polishing apparatus according to the present invention.

Preferred embodiments of the present invention will be described below with reference to the drawings. FIG. 1 shows a CMP apparatus (chemical mechanical polishing apparatus) serving as a representative example of a polishing apparatus according to the present invention. The CMP apparatus 1 comprises a wafer holding table 95 which is capable of holding a wafer 90 serving as a polishing subject on an upper surface side thereof through suction such that the wafer 90 can be detached freely, and a polishing head 30 which is provided above the wafer holding table 95 and holds a polishing member 50 to which a polishing pad 65 is attached so as to face a surface to be polished 91 of the wafer 90 held on the wafer holding table 95. In the CMP apparatus 1, the size (diameter) of the polishing pad 65 is smaller than the size (diameter) of the polishing subject wafer 90 (in other words, the polishing pad 65 has a smaller diameter than the wafer 90), and by moving the polishing pad 65 and the wafer 90 relative to each other while the polishing pad 65 contacts the wafer 90, the entire surface to be polished (upper surface) 91 of the wafer 90 can be polished.

A support frame 20 which supports the wafer holding table 95 and polishing head 30 comprises a horizontal base 21, a first stage 22 provided to be capable of moving freely in a Y direction (a perpendicular direction to the paper surface; to be referred to as the front-back direction) along a rail (not shown) which extends along the base 21 in the Y direction, a vertical frame 23 provided to extend vertically (in a Z direction) from the first stage 22, a second stage 24 provided to be capable of moving freely in the Z direction (the up-down direction) along the vertical frame 23, a horizontal frame 25 provided to extend horizontally (in an X direction) from the second stage 24, and a third stage 26 provided to be capable of moving freely in the X direction (left-right direction) along the horizontal frame 25.

A first electric motor M1 is provided inside the first stage 22, and by driving the first electric motor M1 to rotate, the first stage 22 can be moved in the Y direction along the aforementioned rail. A second electric motor M2 is provided inside the second stage 24, and by driving the second electric motor M2 to rotate, the second stage 24 can be moved in the Z direction along the vertical frame 23. A third electric motor M3 is provided inside the third stage 26, and by driving the third electric motor M3 to rotate, the third stage 26 can be moved in the X direction along the horizontal frame 25. Hence, by combining the rotary operations of the electric motors M1 to M3, the third stage 26 can be moved to an arbitrary position above the wafer holding table 95.

The wafer holding table 95 is mounted horizontally on an upper end portion of a rotary shaft 28 which extends vertically upward from a table support portion 27 provided on the base 21. The rotary shaft 28 is rotated by driving a fourth electric motor M4 provided inside the table support portion 27 to rotate, and in so doing, the wafer holding table 95 can be rotated in the XY plane (horizontal plane).

The polishing head 30 is mounted on a lower end portion of a spindle 29 which extends vertically downward from the third stage 26. The spindle 29 is rotated by driving a fifth electric motor M5 provided inside the third stage 26 to rotate, and in so doing, the entire polishing head 30 can be rotated so that the polishing pad 65 is rotated in the XY plane (horizontal plane).

Figure 2:
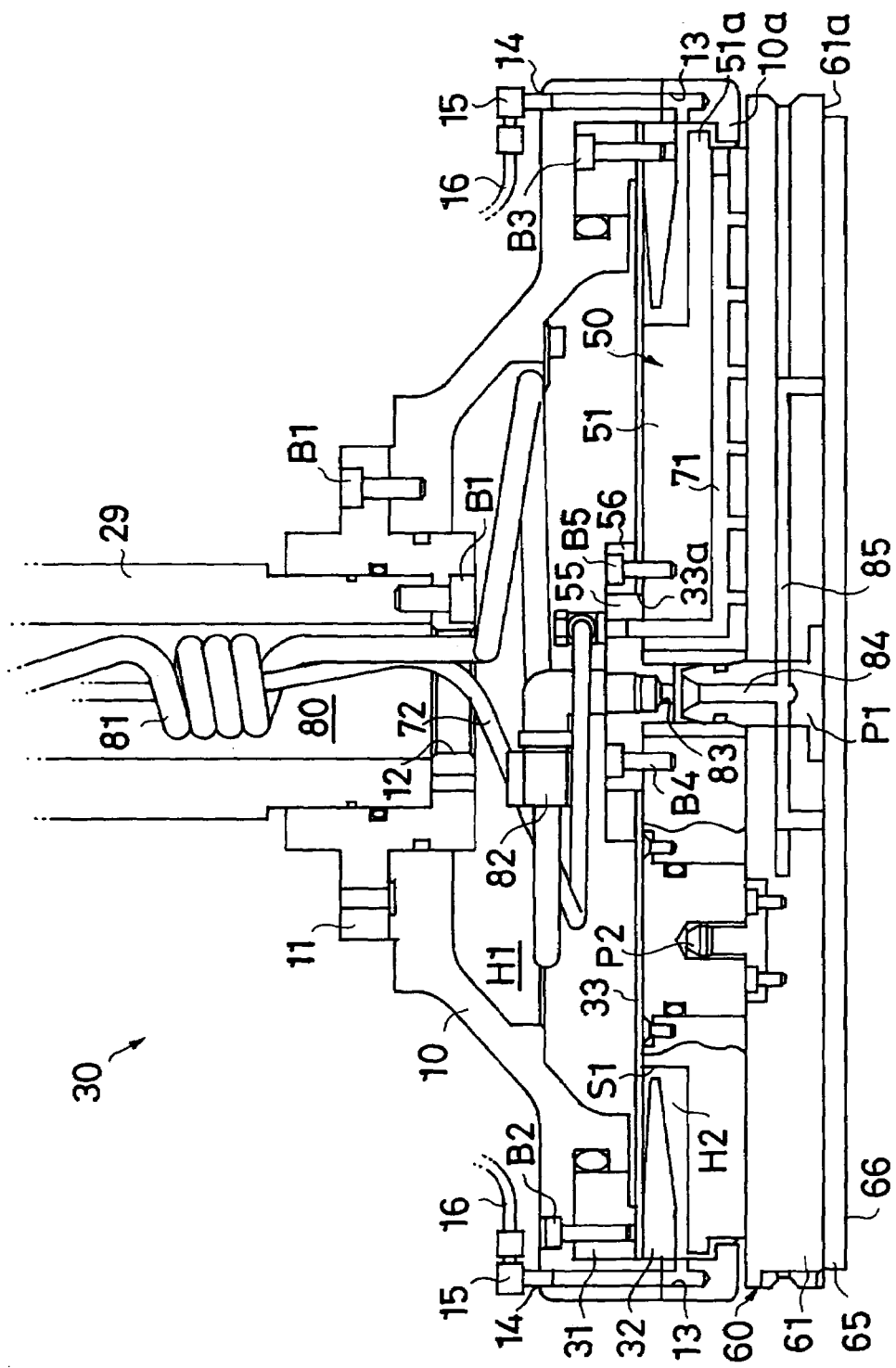
FIG. 2 is a front view (sectional view) of a polishing head provided in the CMP apparatus.

As shown in FIG. 2, the polishing head 30 is constituted by a closed end cylinder-form head housing 10 which is connected to the lower end portion of the spindle 29 by a bolt B1 via a connecting member 11, and which has an opening in the lower surface side thereof, a holding ring 31 which is attached to an upper side portion of the interior of the head housing 10 by a bolt B2, a ring member 32 which is attached to a lower surface side of the holding ring 31 by a bolt B3, a disk-form drive plate 33, an outer peripheral portion of which is sandwiched between the holding ring 31 and ring member 32, and a polishing member 50 mounted in a position on the lower surface side of the drive plate 33.

The drive plate 33 employs a metal plate formed from austenitic stainless steel or the like which is formed into a disk shape having a circular hole 33a in the center, and is fixed in position by having the holding ring 31 and ring member 32 sandwich its outer peripheral portion. A large number of through holes (not shown) arranged concyclically are formed in the drive plate 33, and each through hole is formed to allow the transmission of the air in the interior of the head housing 10.

The polishing member 50 comprises a disk-form reference plate 51 mounted in a position on the lower surface side of the drive plate 33, and a polishing tool 60 mounted detachably on the lower surface of the reference plate 51 by vacuum suction. The reference plate 51 is formed in a stepped disk shape in which the outer diameter of an upper portion is slightly smaller than the inner diameter of the ring member 32, and the outer diameter of a lower portion is slightly smaller than the inner diameter of a flange 10a on the lower end of the head housing 10 (in other words, the opening diameter). The reference plate 51 blocks the opening of the head housing 10, thereby sealing the interior of the head housing 10 such that a pressure chamber H1 is formed in the head housing 10.

An intake port 12 is formed in a central portion of the connecting member 11, and thus air in an air supply passage 80 formed to penetrate the center of the interior of the spindle 29 is supplied to the interior of the head housing 10 (the pressure chamber H1) through the intake port 12. Note that the air supply passage 80 is connected to an air supply source, not shown in the drawing (to be described in detail below), so that the air pressure in the head housing 10 can be adjusted upward to a desired pressure by the air that is supplied from the air supply source.

A disk-form central member 55 having a radius that is slightly smaller than that of the circular hole 33a in the drive plate 33 is fixed to the upper surface side of the central portion of the reference plate 51 by a bolt B4, and an inner peripheral portion of the drive plate 33, which is aligned with the central member 55, is sandwiched between the reference plate 51 and a fixing ring 56 which is fixed to the upper surface side of the reference plate 51 by a bolt B5. Thus the reference plate 51 is fixed to the head housing 10 via the drive plate 33 such that the rotary driving force of the spindle 29 is transmitted to the reference plate 51 via the drive plate 33.

The outer diameter of a flange 51a protruding outward from the outer peripheral portion of the reference plate 51 is formed to be larger than the inner diameter of the flange 10a that protrudes inward from the lower end inner peripheral portion of the head housing 10 to ensure that the reference plate 51 does not become dislodged from the head housing 10.

The polishing tool 60 is constituted by a disk-form pad plate 61 having an outer diameter that is substantially identical to that of the reference plate 51, and a circular polishing pad (abrasive cloth) 65 mounted on a polishing pad mounting surface 61a which constitutes the lower surface of the pad plate 61. Here, the polishing pad 65 is an expendable item which deteriorates as a result of polishing, and is therefore mounted on the polishing pad mounting surface 61a detachably (using an adhesive, for example) to facilitate replacement. Note that the lower end side of the polishing pad 65 serves as a polishing surface 66 which faces the surface to be polished 91 of the wafer 90.

As shown in FIG. 2, an air intake passage 71 having a plurality of suction openings on the lower surface side thereof is formed in the interior of the reference plate 51, and this air intake passage 71 extends to the central member 55 side so as to open onto the side of the pressure chamber H1 of the head housing 10. An intake pipe 72 which extends into the air supply passage 80 of the spindle 29 is connected to this opening portion, and by taking air into the lower surface side of the reference plate 51 from the intake pipe 72 with the pad plate 61 in position, the pad plate 61 can be attached to the reference plate 51 by suction. Here, centering and rotation direction positioning of the pad plate 61 are performed by a center pin P1 and a positioning pin P2 provided between the pad plate 61 and reference plate 51.

Further, a polishing slurry supply pipe 81 connected to a polishing slurry supply apparatus, not shown in the drawing, extends into the interior of the air supply passage 80, and the polishing slurry supply pipe 81 is connected, via a fitting 82 positioned between the spindle 29 and central member 55, to a flow passage 83 provided so as to penetrate the central member 55, a flow passage 84 passing through the interior of the center pin P1, a flow passage 85 provided inside the pad plate 61, and a flow passage (not shown) provided in the polishing pad 65.

The ring member 32 is formed in an annular form having an inner diameter that is slightly larger than the upper portion outer diameter of the reference plate 51, and surrounds the periphery of the upper portion of the reference plate 51 positioned in the interior of the head housing 10 such that a predetermined clearance S1 is formed between the inner peripheral surface of the ring member 32 and the upper portion outer peripheral surface of the reference plate 51. The air pressure in the pressure chamber H1 is received by the central upper surface of the reference plate 51 such that the reference plate 51 which is mounted and held on the lower surface side of the drive plate 33, or in other words the polishing member 50, is capable of a reciprocating motion in an up-down direction (toward the surface to be polished 91).

Since the inner diameter of the ring member 32 is only slightly larger than the upper portion outer diameter of the reference plate 51, the sectional area of the clearance S1 is extremely small, and hence the pressure chamber H1 can be formed in the interior of the head housing 10 without using sealing means such as a rubber sheet to prevent the air in the pressure chamber H1 formed in the head housing 10 from passing through the clearance S1 and escaping to the outside of the pressure chamber H1. As a result, variation in the pressure receiving surface area of the polishing member 50 (reference plate 51) caused by deformation of the rubber sheet due to the up-down motion of the polishing member 50 can be avoided, and hence the linearity between the polishing thrust of the polishing member 50 (polishing pad 65) and the air pressure in the head housing 10 can be increased. Moreover, the control performance during pressurization control when the polishing pad 65 is pressed onto the wafer 90 can be improved, leading to an improvement in the finishing precision of the wafer 90.

Note that a labyrinth space H2 which communicates with the pressure chamber H1 via the clearance S1 is formed between the lower surface side of the ring member 32 and the upper surface side of the edge portion of the reference plate 51, and an exhaust passage 13 connected to the labyrinth space H2 is formed in the side portion of the head housing 10. The exhaust passage 13 is formed to extend to an exhaust port 14 formed in the upper surface side of the head housing 10, and the air inside the head housing 10 is discharged to the outside of the head housing 10 from the labyrinth space H2 through the exhaust passage 13 and exhaust port 14.

A joint 15 and an exhaust pipe 16 are attached to the exhaust port 14, and the exhaust passage 13 is connected to the exhaust pipe 16 via the joint 15. The exhaust pipe 16 is connected to a vacuum source, not shown in the drawing (to be described in detail below), so that the air pressure in the head housing 10 can be adjusted downward to a desired pressure. Since the exhaust port 14 is formed separately from the intake port 12, the reaction rate when switching from increasing to decreasing (or from decreasing to increasing) the air pressure in the head housing 10 can be improved, and the control speed achieved during pressurization control when the polishing pad 65 is pressed onto the wafer 90 can be improved.

To polish the wafer 90 using the CMP apparatus 1 having this constitution, first the polishing subject wafer 90 is attached to the upper surface of the wafer holding table 95 by suction (at this time, the center of the wafer 90 is matched to the center of rotation of the wafer holding table 95), and then the electric moor M4 is driven to rotate the wafer holding table 95. Next, the electric motors M1 to M3 are driven to position the third moving stage 26 above the wafer 90, whereupon the spindle 29 is driven by the electric motor M5 so that the polishing head 30 rotates. Next, the electric motor M2 is driven to lower the third stage 26, thereby pressing the lower surface (polishing surface) of the polishing pad 65 onto the upper surface (surface to be polished) of the wafer 90.

Next, the air pressure in the pressure chamber H1 is adjusted by supplying air into the interior of the head housing 10 from the air supply source or discharging air from the interior of the head housing 10 using the vacuum source, thereby setting the contact pressure between the wafer 90 and polishing pad 65 to a predetermined value. The electric motors M1, M3 are then driven to cause the polishing head 30 to swing in the XY direction (the in-plane direction of the contact surface between the wafer 90 and polishing pad 65). At the same time, a polishing slurry (a liquid slurry containing silica particles) is pumped by the polishing slurry supply apparatus and supplied to the lower surface side of the polishing pad 65. Thus the surface to be polished 91 of the wafer 90 receives the supply of polishing slurry, and is polished by the rotary motion of the wafer 90 itself and the rotary and swinging motions of the polishing head 30 (i.e. the polishing pad 65).

While the surface to be polished 91 of the wafer 90 is being polished in this manner, the polishing member 50 comprising the polishing pad 65 is supported in the head housing 10 via the drive plate 33, and therefore the attitude of the polishing member 50 is varied by elastic deformation of the drive plate 33 in accordance with the rotational accuracy of the polishing head 30 and variation in the thickness of the polishing pad 65, thus enabling even polishing of the surface to be polished 91.

Figure 9:
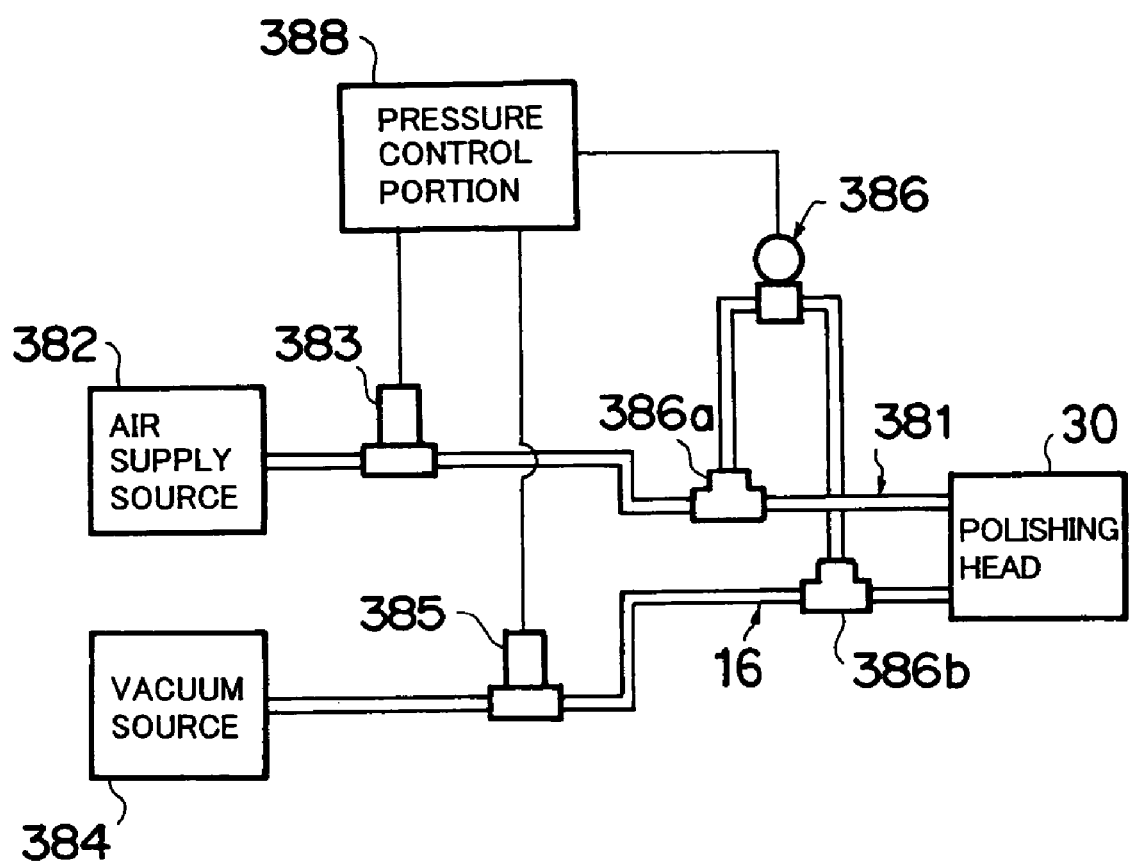
FIG. 9 is an illustrative view showing an outline of an air circuit connected to the polishing head.
Figure 10A:
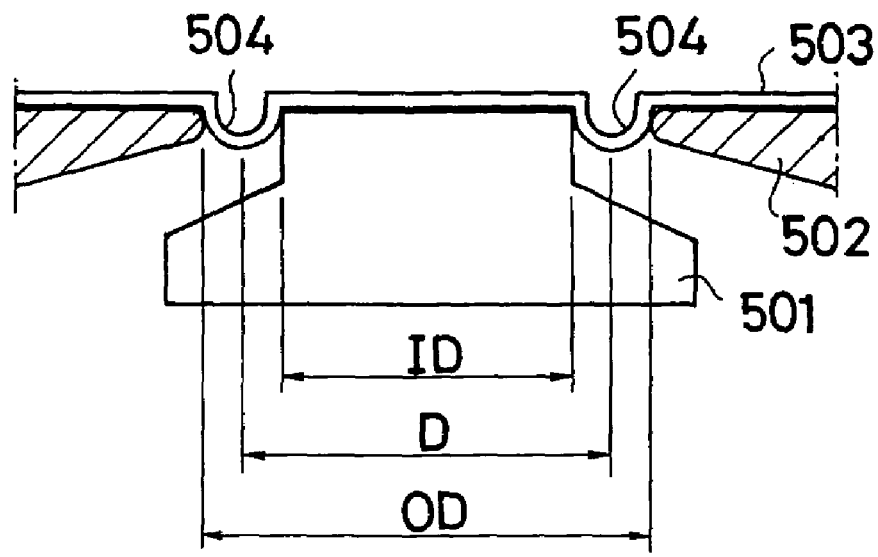
FIGS. 10A and 10B are views showing in sequence variation in the form of a rubber sheet caused by the raising and lowering of a polishing member in a conventional polishing apparatus.
Figure 10B:
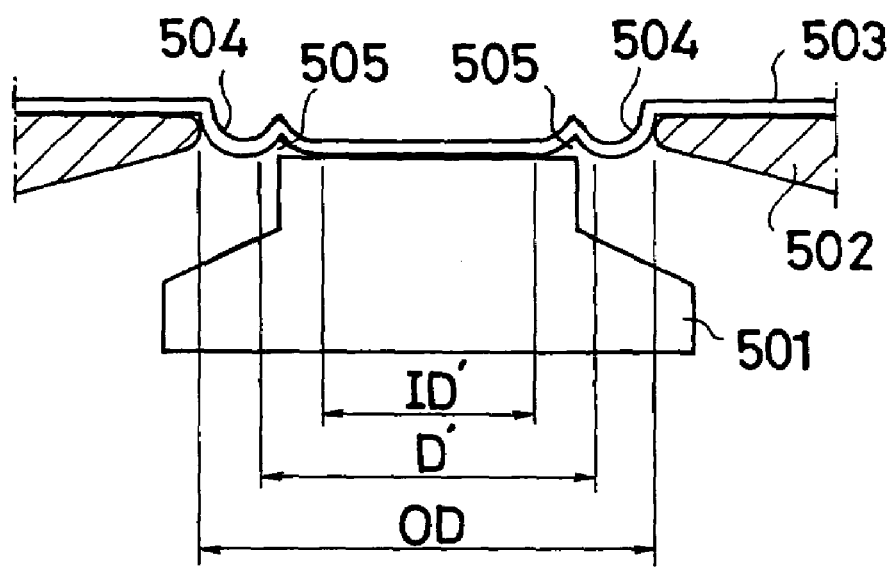

An air circuit connected to the polishing head 30 will now be described with reference to FIG. 9. The air supply pipe 381 for supplying air into the head housing 10 and the exhaust pipe 16 for discharging air from the head housing 10 are connected to the polishing head 30.

Although not shown in detail in the drawing, one end of the air supply pipe 381 is connected to the intake port 12 of the polishing head 30 via the air supply passage 80 of the spindle 29 (see FIG. 2), and the other end is connected to the air supply source 382. A supply side regulator 383 is provided on the other end side of the air supply pipe 381 so that the air pressure of the air that is supplied from the air supply source 382 can be regulated. Note that the air supply source 382 and supply side regulator 383 constitute an air supply portion according to the present invention.

Meanwhile, although not shown in detail in the drawing, one end of the exhaust pipe 16 is connected to the exhaust port 14 of the polishing head 30 via the joint 15 (see FIG. 2), and the other end is connected to the vacuum source 384. An exhaust side regulator 385 is provided at the other end side of the exhaust pipe 16 so that the air pressure in the exhaust pipe 16 can be regulated. Note that the vacuum source 384 and exhaust side regulator 385 constitute an air discharging portion according to the present invention. Further, the supply side regulator 383 and exhaust side regulator 385 are electrically connected to a pressure control portion 388 such that the supply side regulator 383 and exhaust side regulator 385 operate upon reception of an operating signal from the pressure control portion 388.

Furthermore, a differential pressure gauge 386 is arranged astride the air supply pipe 381 and exhaust pipe 16. The differential pressure gauge 386 is constituted by a supply side pressure measuring portion 386*a* which is capable of measuring the air pressure in the air supply pipe 381 and an exhaust side pressure measuring portion 386*b* which is capable of measuring the air pressure in the exhaust pipe 16. The differential pressure gauge 386 measures the differential pressure between the air pressure in the air supply pipe 381 and the air pressure in the exhaust pipe 16 on the basis of the air pressure in the air supply pipe 381 and the air pressure in the exhaust pipe 16, measured by the supply side pressure measuring portion 386*a* and exhaust side pressure measuring portion 386*b*, and outputs a measurement signal to the pressure control portion 388.

As described above, the pressure control portion 388 is electrically connected to the supply side regulator 383 and exhaust side regulator 385, and is also electrically connected to the differential pressure gauge 386. The pressure control portion 388 measures the air pressure in the head housing 10 (pressure chamber H1) of the polishing head 30 on the basis of the differential pressure between the air pressure in the air supply pipe 381 and the air pressure in the exhaust pipe 16, measured by the differential pressure gauge 386, and outputs operating signals to the supply side regulator 383 and exhaust side regulator 385 so that the measured air pressure in the head housing 10 matches a desired air pressure that is set and input in advance.

In the air circuit constituted in this manner, when an operator sets and inputs the desired air pressure of the head housing using an input apparatus not shown in the drawing, the pressure control portion 388 measures the air pressure in the head housing 10 on the basis of the differential pressure between the air pressure in the air supply pipe 381 and the air pressure in the exhaust pipe 16, measured by the differential pressure gauge 386, and outputs operating signals to the supply side regulator 383 and exhaust side regulator 385 to activate the supply side regulator 383 and exhaust side regulator 385 so that the measured air pressure in the head housing 10 matches the set and input desired air pressure.

The air that is supplied from the air supply source 382 into the air supply pipe 381 via the supply side regulator 383 passes through the air supply pipe 381 and the air supply passage 80 of the spindle 29, then passes through the intake port 12 to be supplied to the interior of the head housing 10. Further, the air in the head housing 10 passes through the exhaust port 14, joint 15, and exhaust pipe 16, and is discharged to the outside from the vacuum source 384 via the exhaust side regulator 385.

By constituting the air circuit in the manner described above, the reaction rate when switching from increasing to decreasing (or from decreasing to increasing) the air pressure in the head housing 10 can be improved, and the control speed achieved during pressurization control when the polishing pad 65 is pressed onto the wafer 90 can be improved. Moreover, the thrust required to move the polishing member 50 (polishing pad 65) downward and the thrust required to move the polishing member 50 upward can be controlled to substantially identical values, and hence the control performance during pressurization control when the polishing pad 65 is pressed onto the wafer 90 can be improved. Furthermore, by employing the differential pressure gauge 386 comprising the supply side pressure measuring portion 386a and exhaust side pressure measuring portion 386b, the air pressure in the interior of the rotating head housing 10 can be measured easily.

Figure 3:
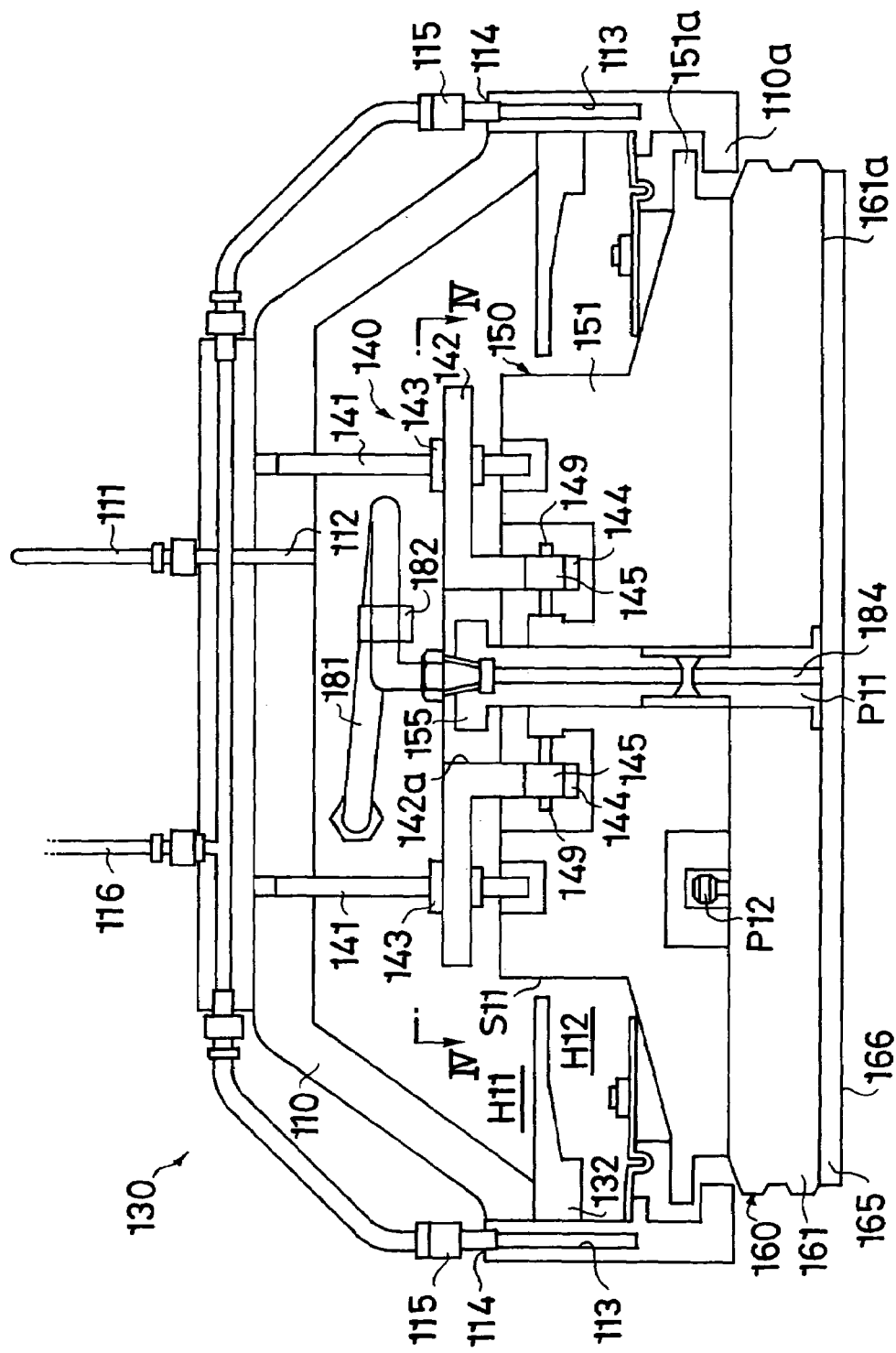
FIG. 3 is a front view (sectional view) showing a second embodiment of a polishing head.

Next, a second embodiment of the polishing head will be described with reference to FIG. 3. A polishing head 130 according to the second embodiment comprises a closed end cylinder-form head housing 110 which is connected to a lower end portion of a spindle (not shown) and has an opening in a lower surface side thereof, a ring member 132 which is attached to an upper side portion of the interior of the head housing 110, a plate holding portion 140 mounted on an upper base portion of the interior of the head housing 110, and a polishing member 150 held on the plate holding portion 140.

Figure 4:
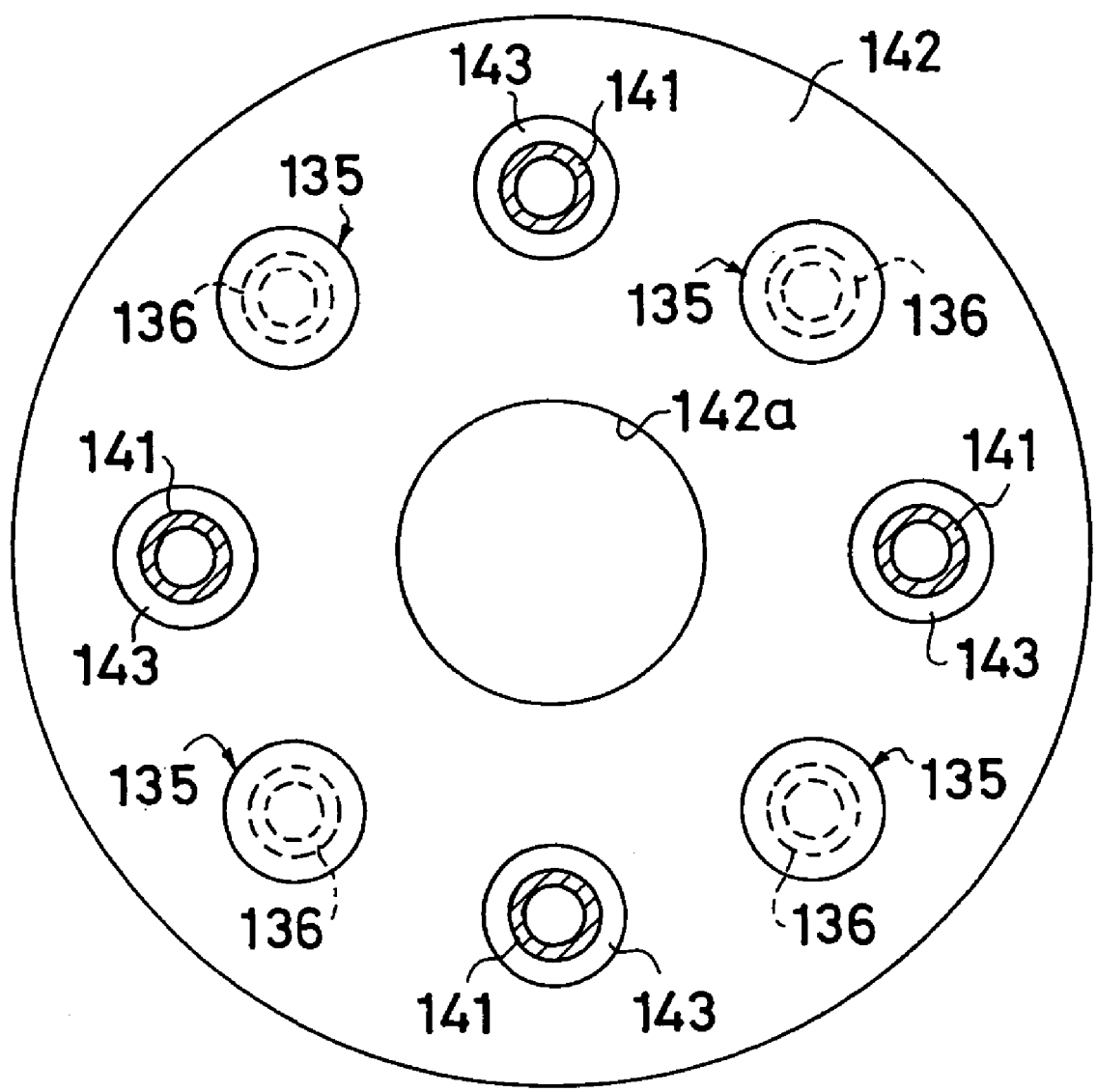
FIG. 4 is a sectional plan view taken along an arrow IV—IV in FIG. 3.

The plate holding portion 140 is constituted by shaft-form slide guide members 141, 141, . . . , which extend downward (toward the surface to be polished 91) from the upper base portion of the interior of the head housing 110, a disk-form slide member 142 provided on the slide guide members 141 to be capable of a reciprocating motion in the up-down direction, and a swing holding member 145 provided on a lower end of the slide member 142 for holding the polishing member 150 swingably. As shown in FIG. 4, the four slide guide members 141, 141, . . . , are arranged concyclically in the disk-form slide member 142, and are attached thereto using linear bushes 143 so that the slide member 142 is capable of a reciprocating motion in the up-down direction (toward the surface to be polished 91).

Figure 5:
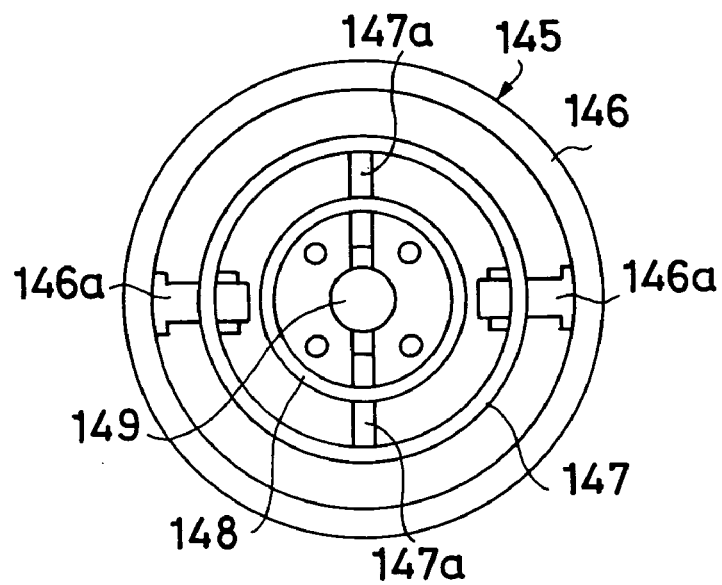
FIG. 5 is a side view of a swing holding member.

A housing portion 144 is formed on the lower end portion of the slide member 142, and the swing holding member 145 is mounted thereon. As shown in FIG. 5, the swing holding member 145 is constituted by a first ring 146 which is attached and fixed to the housing portion 144, a second ring 147 connected swingably to the first ring 146 via a first shaft portion 146a, a third ring 148 connected swingably to the second ring 147 via a second shaft portion 147a orthogonal to the first shaft portion 146a, and a third shaft portion 149 which is held rotatably by the third ring 148, connected to a reference plate 151 of the polishing member 150, and positioned orthogonal to the first shaft portion 146a and second shaft portion 147a. The polishing member 150 (reference plate 151) is swingably attached to and held by the swing holding member 145 using the mutually orthogonal first through third shaft portions 146a, 147a, 149 as swinging shafts.

Hence, the polishing member 150 is attached to and held by the plate holding portion 140 so as to be capable of a reciprocating motion in the up-down direction (toward the surface to be polished 91) and a swinging motion, and thus the rotary driving force of the spindle is transmitted to the polishing member 150 (reference plate 151) via the plate holding portion 140. Therefore, the polishing member 150 can be held so as to be capable of a reciprocating motion in the up-down direction (toward the surface to be polished 91) and a swinging motion without the use of a drive plate. As a result, the elastic force generated by plastic deformation of a drive ring does not act on the polishing member 150 (reference plate 151), and hence errors in the polishing thrust of the polishing member 150 (polishing pad 165) caused by variation in the thickness of the polishing pad 165 do not occur. Moreover, the control performance during pressurization control when the polishing pad 165 is pressed onto the wafer 90 can be improved, leading to an improvement in the finishing precision of the wafer 90.

Note that gimbals having two orthogonal rotary shafts so as to be capable of transmitting a rotary motion in two directions may be used as the swing holding member 145, as may a universal joint.

Figure 6:
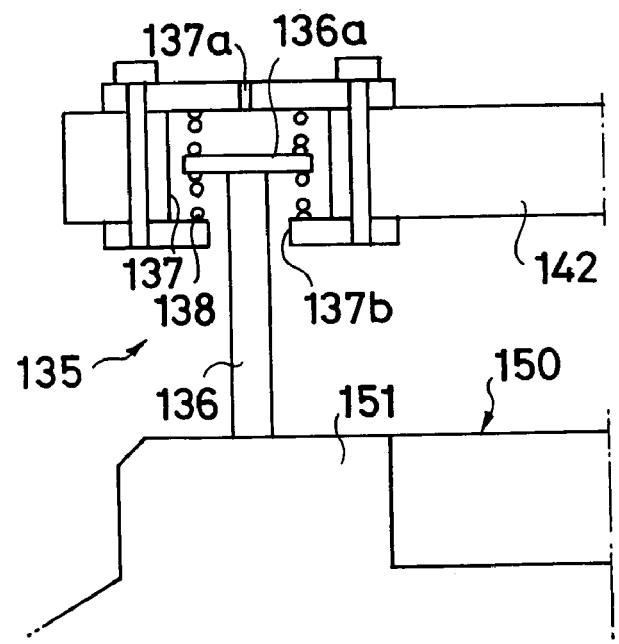
FIG. 6 is a sectional side view of a swing buffering mechanism.

Further, as shown in FIGS. 4 and 6, four swing buffering mechanisms 135 of the polishing member 150 are provided astride the polishing member 150 and slide member 142. These swing buffering mechanisms 135, 135, . . . , are arranged concyclically with the slide guide members 141 in the slide member 142, and each comprise a piston shaft 136 mounted on the reference plate 151 of the polishing member 150, and a piston chamber 137 formed in the slide member 142 for accommodating a piston 136a formed on the head portion of the piston shaft 136. When the piston 136a moves in the up-down direction as the polishing member 150 swings, air on the interior and exterior of the piston chamber 137 passes through orifices 137a, 137b formed in the top and bottom of the piston chamber 137. As a result, a damper effect is generated, preventing rapid swinging of the polishing member 150.

Further, as shown in FIG. 6, a biasing spring 138 capable of urging the piston 136a may be provided inside the piston chamber 137 to urge the polishing member 150 (a polishing surface 166) into a position facing the surface to be polished 91. In so doing, the swingable polishing member 150 can be held with stability.

The polishing member 150 is constituted by the disk-form reference plate 151 which is mounted and held on the plate holding portion 140, and a polishing tool 160 mounted detachably on the lower surface of the reference plate 151 by vacuum suction. The reference plate 151 is formed in a stepped disk shape in which the outer diameter of an upper portion is slightly smaller than the inner diameter of the ring member 132, and the outer diameter of a lower portion is slightly smaller than the inner diameter of a flange 110a on the lower end of the head housing 110 (in other words, the opening diameter). The reference plate 151 blocks the opening of the head housing 110, thereby sealing the interior of the head housing 110 such that a pressure chamber H11 is formed in the head housing 110.

An intake port 112 is formed in an upper portion of the head housing 110, and thus air in an air supply pipe 111 connected to the intake port 112 is supplied to the interior of the head housing 110 (the pressure chamber H11) through the intake port 112. Note that the air supply pipe 111 is connected to an air supply source, not shown in the drawing, so that the air pressure in the interior of the head housing 110 can be adjusted upward to a desired pressure by the air that is supplied from the air supply source.

A cylindrical central member 155 having a smaller diameter than that of a circular hole 142a formed in the slide member 142 is fixed to the upper surface side of the central portion of the reference plate 151, and a fitting 182 for connecting the central member 155 to a polishing slurry supply pipe 181 is mounted thereon. The outer diameter of a flange 151a protruding outward from the outer peripheral portion of the reference plate 151 is formed to be larger than the inner diameter of the flange 110a that protrudes inward from the lower end inner peripheral portion of the head housing 110 to ensure that the reference plate 151 does not become dislodged from the head housing 110.

The polishing tool 160 is constituted by a disk-form pad plate 161 having an outer diameter that is substantially identical to that of the reference plate 151, and a circular polishing pad (abrasive cloth) 165 mounted on a polishing pad mounting surface 161a which constitutes the lower surface of the pad plate 161. Here, the polishing pad 165 is an expendable item which deteriorates as a result of polishing, and is therefore mounted on the polishing pad mounting surface 161a detachably (using an adhesive, for example) to facilitate replacement. Note that the lower end side of the polishing pad 165 serves as a polishing surface 166 which faces the surface to be polished 91 of the wafer 90.

Although not shown in detail in the drawing, similarly to the polishing tool 60 of the first embodiment, an air intake passage (not shown) having a plurality of suction openings (not shown) on the lower surface side thereof is formed in the interior of the reference plate 151, and this air intake passage extends to the central member 155 side so as to open onto the side of the pressure chamber H11 of the head housing 110. An intake pipe (not shown) is connected to this opening portion, and by taking air into the lower surface side of the reference plate 151 from the intake pipe with the pad plate 161 in position, the pad plate 161 can be attached to the reference plate 151 by suction. Here, centering and rotation direction positioning of the pad plate 161 are performed by a center pin P11 and a positioning pin P12 provided between the pad plate 161 and reference plate 151.

Further, the polishing slurry supply pipe 181 connected to a polishing slurry supply apparatus, not shown in the drawing, is connected to the fitting 182 attached to the central member 155, and via the fitting 182, the polishing slurry supply pipe 181 is connected to a flow passage 183 provided so as to penetrate the central member 155, a flow passage 184 passing through the interior of the center pin P11, and a flow passage (not shown) provided in the pad plate 161 and polishing pad 165.

The ring member 132 is formed in an annular form having an inner diameter that is slightly larger than the upper portion outer diameter of the reference plate 151, and surrounds the periphery of the upper portion of the reference plate 151 positioned in the interior of the head housing 110 such that a predetermined clearance S11 is formed between the inner peripheral surface of the ring member 132 and the upper portion outer peripheral surface of the reference plate 151. The air pressure in the pressure chamber H11 is received by the central upper surface of the reference plate 151 such that the reference plate 151 that is mounted and held on the plate holding portion 140, or in other words the polishing member 150, is capable of a reciprocating motion in the up-down direction (toward the surface to be polished 91).

Since the inner diameter of the ring member 132 is only slightly larger than the upper portion outer diameter of the reference plate 151, the sectional area of the clearance S11 is extremely small, and hence the pressure chamber H11 can be formed in the interior of the head housing 110 without using sealing means such as a rubber sheet to prevent the air in the pressure chamber H11 formed in the head housing 110 from passing through the clearance S11 and escaping to the outside of the pressure chamber H11. As a result, variation in the pressure receiving surface area of the polishing member 150 (reference plate 151) caused by deformation of the rubber sheet due to the up-down motion of the polishing member 150 can be avoided, and hence the linearity between the polishing thrust of the polishing member 150 (polishing pad 165) and the air pressure in the head housing 110 can be increased. Moreover, the control performance during pressurization control when the polishing pad 165 is pressed onto the wafer 90 can be improved, leading to an improvement in the finishing precision of the wafer 90.

Note that a labyrinth space H12 which communicates with the pressure chamber H11 via the clearance S11 is formed between the lower surface side of the ring member 132 and the upper surface side of the edge portion of the reference plate 151, and an exhaust passage 113 connected to the labyrinth space H12 is formed in the side portion of the head housing 110. The exhaust passage 113 is formed to extend to an exhaust port 114 formed in the upper surface side of the head housing 110, and the air inside the head housing 110 is discharged to the outside of the head housing 110 from the labyrinth space H12 through the exhaust passage 113 and exhaust port 114.

A joint 115 and an exhaust pipe 116 are attached to the exhaust port 114, and the exhaust passage 113 is connected to the exhaust pipe 116 via the joint 115. The exhaust pipe 116 is connected to a vacuum source, not shown in the drawing, so that the air pressure in the head housing 110 can be adjusted downward to a desired pressure. Since the exhaust port 114 is formed separately from the intake port 112, the reaction rate when switching from increasing to decreasing (or from decreasing to increasing) the air pressure in the head housing 110 can be improved, and the control speed achieved during pressurization control when the polishing pad 165 is pressed onto the wafer 90 can be improved.

To polish the wafer 90 using the polishing head 130 having this constitution, first the polishing subject wafer 90 is attached to the upper surface of the wafer holding table 95 by suction (at this time, the center of the wafer 90 is matched to the center of rotation of the wafer holding table 95), and then the electric moor M4 is driven to rotate the wafer holding table 95. Next, the electric motors M1 to M3 are driven to position the third moving stage 26 above the wafer 90, whereupon the spindle is driven by the electric motor M5 so that the polishing head 130 rotates. Next, the electric motor M2 is driven to lower the third stage 26, thereby pressing the lower surface (polishing surface) of the polishing pad 165 onto the upper surface (surface to be polished) of the wafer 90.

Next, the air pressure in the pressure chamber H11 is adjusted by supplying air into the head housing 110 from the air supply source or discharging air from the head housing 110 using the vacuum source, thereby setting the contact pressure between the wafer 90 and polishing pad 165 to a predetermined value. The electric motors M1, M3 are then driven to cause the polishing head 130 to swing in the XY direction (the in-plane direction of the contact surface between the wafer 90 and polishing pad 165). At the same time, a polishing slurry (a liquid slurry containing silica particles) is pumped by the polishing slurry supply apparatus and supplied to the lower surface side of the polishing pad 165. Thus the surface to be polished 91 of the wafer 90 receives the supply of polishing slurry, and is polished by the rotary motion of the wafer 90 itself and the rotary and swinging motions of the polishing head 130 (i.e. the polishing pad 165).

While the surface to be polished 91 of the wafer 90 is being polished in this manner, the polishing member 150 comprising the polishing pad 165 is mounted on and held by the plate holding portion 140 so as to be capable of a reciprocating motion in the up-down direction (toward the surface to be polished 91) and a swinging motion, and therefore the attitude of the polishing member 150 varies in accordance with the rotational accuracy of the polishing head 130 and variation in the thickness of the polishing pad 165, thus enabling even polishing of the surface to be polished 91.

Figure 7:
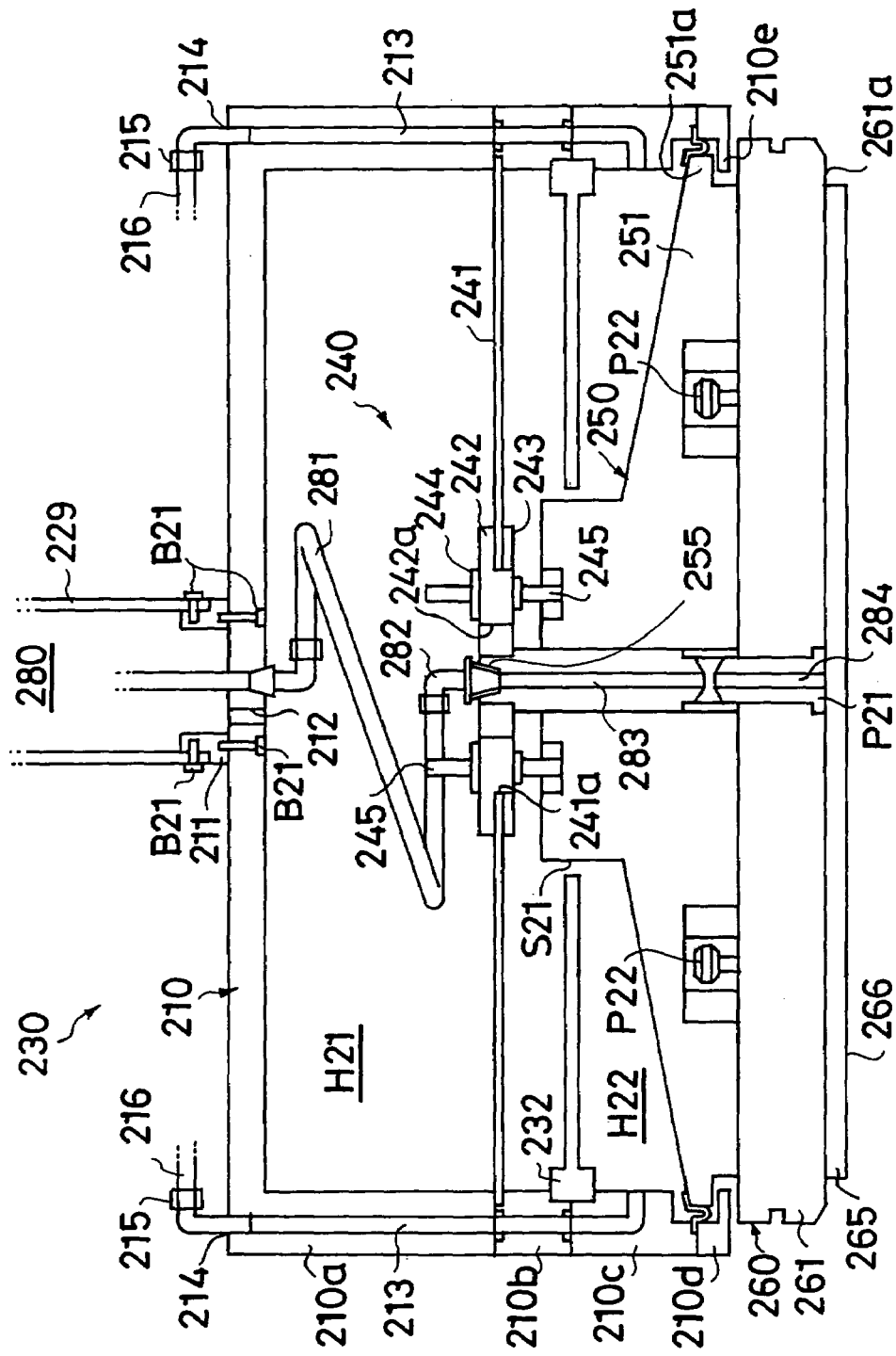
FIG. 7 is a front view (sectional view) showing a third embodiment of a polishing head.

Next, a third embodiment of the polishing head will be described with reference to FIG. 7. A polishing head 230 according to the third embodiment comprises a closed end cylinder-form head housing 210 which is connected to a lower end portion of a spindle 229 via a connecting member 211 by a bolt B21 and has an opening in a lower surface side thereof, a ring member 232 which is attached to an inside portion of the head housing 210, a plate holding portion 240 mounted on an upper portion of the ring member 232 in the inside portion of the head housing 210, and a polishing member 250 held on the plate holding portion 240.

The head housing 210 is constituted by a closed end cylinder-form first housing portion 210a, an annular second housing portion 210b mounted on the first housing portion 210a, an annular third housing portion 210c, and a fourth housing portion 210d, which are assembled in a closed end cylinder form having an opening in the lower surface side thereof. A drive plate 241 of the plate holding portion 240 is sandwiched between the first housing portion 210a and second housing portion 210b, and the ring member 232 is sandwiched between the second housing portion 210b and third housing portion 210c.

The plate holding portion 240 is constituted by the disk-form drive plate 241, which is attached to the inside portion of the head housing, a first holding ring 242 and a second holding ring 243 attached to a central portion of the drive plate 241, and a plurality of slide shafts 245 held by the first holding ring 242 using linear bushes 244 to be capable of a reciprocating motion in the up-down direction (toward the surface to be polished 91), and connected and fixed to a reference plate 251 of the polishing member 250 at the lower end portion thereof.

The drive plate 241 employs a metal plate formed from austenitic stainless steel or the like which is formed into a disk shape having a circular hole 241a in the center, and is fixed in position by having the first housing portion 210a and second housing portion 210b sandwich its outer peripheral portion. A large number of through holes (not shown) arranged concyclically are formed in the drive plate 241, and each through hole is formed to allow the transmission of the air in the interior of the head housing 210.

The first holding ring 242 and second holding ring 243 are positioned within the circular hole 241a of the drive plate 241, and are fixed so as to sandwich the inner peripheral portion of the drive plate 241. A plurality of linear bushes 244 is attached to the first holding ring 242, and the slide shafts 245 are held by the linear bushes 244 so as to be capable of a reciprocating motion in the up-down direction (toward the surface to be polished 91).

Hence, the polishing member 250 is mounted and held on the plate holding portion 240 so as to be capable of a reciprocating motion in the up-down direction (toward the surface to be polished 91) and a swinging motion by means of the elastic deformation of the drive plate 241 and the reciprocating motion of the slide shafts 245, and the rotary driving force of the spindle 229 is thus transmitted to the polishing member 250 (reference plate 251) via the plate holding portion 240.

The polishing member 250 comprises the disk-form reference plate 251 mounted and held on the plate holding portion 240, and a polishing tool 260 mounted detachably on the lower surface of the reference plate 251 by vacuum suction. The reference plate 251 is formed in a stepped disk shape in which the outer diameter of an upper portion is slightly smaller than the inner diameter of the ring member 232, and the outer diameter of a lower portion is slightly smaller than the inner diameter of a flange 210e on the lower end of the head housing 210 (in other words, the opening diameter). The reference plate 251 blocks the opening of the head housing 210, thereby sealing the interior of the head housing 210 such that a pressure chamber H21 is formed in the head housing 210.

An intake port 212 is formed in an upper portion of the head housing 210, and thus air in an air supply passage 280 formed to penetrate the center of the interior of the spindle 229 is supplied to the interior of the head housing 210 (the pressure chamber H21) through the intake port 212. Note that the air supply passage 280 is connected to an air supply source, not shown in the drawing, so that the air pressure in the interior of the head housing 210 can be adjusted upward to a desired pressure by the air that is supplied from the air supply source.

A cylindrical central member 255 having a smaller diameter than that of the circular hole 242a formed in the first holding ring 242 is fixed to the upper surface side of the central portion of the reference plate 251, and a fitting 282 for connecting the central member 255 to a polishing slurry supply pipe 281 is mounted thereon. The outer diameter of a flange 251a protruding outward from the outer peripheral portion of the reference plate 251 is formed to be larger than the inner diameter of the flange 210e that protrudes inward from the lower end inner peripheral portion of the head housing 210 to ensure that the reference plate 251 does not become dislodged from the head housing 210.

The polishing tool 260 is constituted by a disk-form pad plate 261 having an outer diameter that is substantially identical to that of the reference plate 251, and a circular polishing pad (abrasive cloth) 265 mounted on a polishing pad mounting surface 261a which constitutes the lower surface of the pad plate 261. Here, the polishing pad 265 is an expendable item which deteriorates as a result of polishing, and is therefore mounted on the polishing pad mounting surface 261a detachably (using an adhesive, for example) to facilitate replacement. Note that the lower end side of the polishing pad 265 serves as a polishing surface 266 which faces the surface to be polished 91 of the wafer 90.

Although not shown in detail in the drawing, similarly to the polishing tool 60 of the first embodiment, an air intake passage (not shown) having a plurality of suction openings (not shown) on the lower surface side thereof is formed in the interior of the reference plate 251, and this air intake passage extends to the central member 255 side so as to open onto the side of the pressure chamber H21 of the head housing 210. An intake pipe (not shown) is connected to this opening portion, and by taking air into the lower surface side of the reference plate 251 from the intake pipe with the pad plate 261 in position, the pad plate 261 can be attached to the reference plate 251 by suction. Here, centering and rotation direction positioning of the pad plate 261 are performed by a center pin P21 and a positioning pin P22 provided between the pad plate 261 and reference plate 251.

Further, the polishing slurry supply pipe 281 connected to a polishing slurry supply apparatus, not shown in the drawing, is connected to the fitting 282 attached to the central member 255, and via the fitting 282, the polishing slurry supply pipe 281 is connected to a flow passage 283 provided so as to penetrate the central member 255, a flow passage 284 passing through the interior of the center pin P21, and a flow passage (not shown) provided in the pad plate 261 and polishing pad 265.

The ring member 232 is formed in an annular form having an inner diameter than is slightly larger than the upper portion outer diameter of the reference plate 251, and surrounds the periphery of the upper portion of the reference plate 251 positioned in the interior of the head housing 210 such that a predetermined clearance S21 is formed between the inner peripheral surface of the ring member 232 and the upper portion outer peripheral surface of the reference plate 251. The air pressure in the pressure chamber H21 is received by the central upper surface of the reference plate 251 such that the reference plate 251 that is mounted and held on the plate holding portion 240, or in other words the polishing member 250, is capable of a reciprocating motion in the up-down direction (toward the surface to be polished 91).

Since the inner diameter of the ring member 232 is only slightly larger than the upper portion outer diameter of the reference plate 251, the sectional area of the clearance S21 is extremely small, and hence the pressure chamber H21 can be formed in the interior of the head housing 210 without using sealing means such as a rubber sheet to prevent the air in the pressure chamber H21 formed in the head housing 210 from passing through the clearance S21 and escaping to the outside of the pressure chamber H21. As a result, variation in the pressure receiving surface area of the polishing member 250 (reference plate 251) caused by deformation of the rubber sheet due to the up-down motion of the polishing member 250 can be avoided, and hence the linearity between the polishing thrust of the polishing member 250 (polishing pad 265) and the air pressure in the head housing 210 can be increased. Moreover, the control performance during pressurization control when the polishing pad 265 is pressed onto the wafer 90 can be improved, leading to an improvement in the finishing precision of the wafer 90.

Note that a labyrinth space H22 which communicates with the pressure chamber H21 via the clearance S21 is formed between the lower surface side of the ring member 232 and the upper surface side of the edge portion of the reference plate 251, and an exhaust passage 213 connected to the labyrinth space H22 is formed in the side portion of the head housing 210. The exhaust passage 213 is formed to extend to an exhaust port 214 formed in the upper surface side of the head housing 210, and the air inside the head housing 210 is discharged to the outside of the head housing 210 from the labyrinth space H22 through the exhaust passage 213 and exhaust port 214.

A joint 215 and an exhaust pipe 216 are attached to the exhaust port 214, and the exhaust passage 213 is connected to the exhaust pipe 216 via the joint 215. The exhaust pipe 216 is connected to a vacuum source, not shown in the drawing, so that the air pressure in the head housing 210 can be adjusted downward to a desired pressure. Since the exhaust port 214 is formed separately from the intake port 212, the reaction rate when switching from increasing to decreasing (or from decreasing to increasing) the air pressure in the head housing 210 can be improved, and the control speed achieved during pressurization control when the polishing pad 265 is pressed onto the wafer 90 can be improved.

To polish the wafer 90 using the polishing head 230 having this constitution, first the polishing subject wafer 90 is attached to the upper surface of the wafer holding table 95 by suction (at this time, the center of the wafer 90 is matched to the center of rotation of the wafer holding table 95), and then the electric moor M4 is driven to rotate the wafer holding table 95. Next, the electric motors M1 to M3 are driven to position the third moving stage 26 above the wafer 90, whereupon the spindle is driven by the electric motor M5 so that the polishing head 230 rotates. Next, the electric motor M2 is driven to lower the third stage 26, thereby pressing the lower surface (polishing surface) of the polishing pad 265 onto the upper surface (surface to be polished) of the wafer 90.

Next, the air pressure in the pressure chamber H21 is adjusted by supplying air into the head housing 210 from the air supply source or discharging air from the head housing 210 using the vacuum source, thereby setting the contact pressure between the wafer 90 and polishing pad 265 to a predetermined value. The electric motors M1, M3 are then driven to cause the polishing head 230 to swing in the XY direction (the in-plane direction of the contact surface between the wafer 90 and polishing pad 265). At the same time, a polishing slurry (a liquid slurry containing silica particles) is pumped by the polishing slurry supply apparatus and supplied to the lower surface side of the polishing pad 265. Thus the surface to be polished 91 of the wafer 90 receives the supply of polishing slurry, and is polished by the rotary motion of the wafer 90 itself and the rotary and swinging motions of the polishing head 230 (i.e. the polishing pad 265).

While the surface to be polished 91 of the wafer 90 is being polished in this manner, the polishing member 250 comprising the polishing pad 265 is mounted and held on the plate holding portion 240 so as to be capable of a reciprocating motion in the up-down direction (toward the surface to be polished 91) and a swinging motion, and therefore the attitude of the polishing member 250 varies in accordance with the rotational accuracy of the polishing head 230 and variation in the thickness of the polishing pad 265, thus enabling even polishing of the surface to be polished 91.

Figure 8:
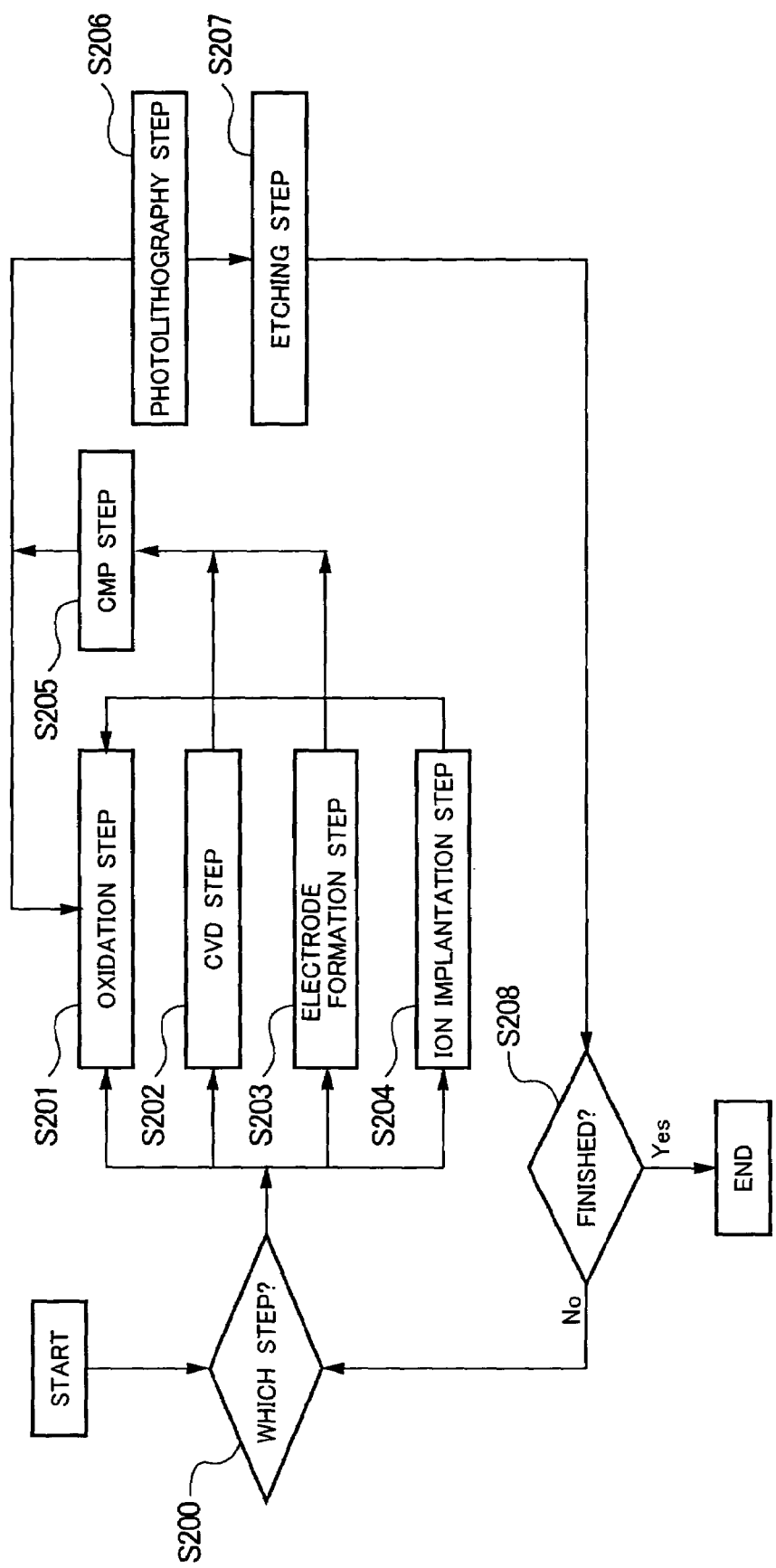
FIG. 8 is a flowchart showing a manufacturing process for a semiconductor device according to the present invention.

Next, an example of a method of manufacturing a semiconductor device according to the present invention will be described. FIG. 8 is a flowchart showing a semiconductor device manufacturing process. When starting the semiconductor manufacturing process, first, in a step S200, an appropriate process is selected from steps S201 to S204 following the step S200, whereupon the process advances from the selected step.

Here, the step S201 is an oxidation step for oxidizing a wafer surface. The step S202 is a CVD step for forming an insulation film or dielectric film on the wafer surface by means of CVD or the like. The step S203 is an electrode formation step for forming an electrode on the wafer through vapor deposition or the like. The step S204 is an ion implantation step for implanting ions in the wafer.

Following the CVD step (S202) or electrode formation step (S203), the process advances to a step S205. The step S205 is a CMP step. In the CMP step, the polishing apparatus according to the present invention is employed to perform interlayer insulator flattening, polishing of the metal film on the surface of the semiconductor device, polishing of the dielectric film, and so on, a damascene process being applied thereto.

Following the CMP step (S205) or the oxidation step (S201), the process advances to a step S206. The step S206 is a photolithography step. In this step, the wafer is coated with resist, a circuit pattern is baked onto the wafer by means of exposure using an exposure apparatus, and the exposed wafer is developed. A following step S207 is an etching step for removing parts other than the developed resist image by etching and then performing resist peeling to remove the resist which is no longer necessary following the completion of etching.

Next, in a step S208, a determination is made as to whether or not all of the required steps are complete, and if not, the process returns to the step S200 to form a circuit pattern on the wafer by repeating the previous steps. If it is determined in the step S208 that all steps are complete, the process ends.

In the semiconductor device manufacturing method according to the present invention, the polishing apparatus of the present invention is used in the CMP step, and hence the wafer finishing precision and yield are improved. As a result, semiconductor devices can be manufactured at a lower cost than with a conventional semiconductor device manufacturing method. Note that the polishing apparatus according to the present invention may be used in the CMP step of a semiconductor device manufacturing process other than the semiconductor device manufacturing process described above. Furthermore, semiconductor devices manufactured by the semiconductor device manufacturing method according to the present invention have a high yield and a low cost.

According to the present invention as described above, the control performance during pressurization control when a polishing pad is pressed onto a polishing subject can be improved, leading to an improvement in the finishing precision of the polishing subject.

What is claimed is:

1. A polishing apparatus comprising a subject holder for holding a polishing subject and a polishing head having a polishing member provided with a polishing surface on a surface thereof which faces a surface to be polished of said polishing subject, said polishing apparatus being constituted to perform polishing of said surface to be polished by moving said polishing surface relative to said surface to be polished while said polishing surface is in contact with said surface to be polished,
  characterized in that said polishing head comprises a head housing having an opening in a surface thereof which faces said surface to be polished, and a plate holding portion provided in said head housing for holding said polishing member,
  a ring member provided in an inside portion of said head housing, said ring member is formed to surround the periphery of said polishing member positioned within said head housing such that a predetermined clearance is formed between said ring member and an outer peripheral portion of said polishing member, in a radial direction of the ring member,
  said polishing member is provided in said head housing so as to block said opening, and constituted to be capable of a reciprocating motion in the direction of said surface to be polished using air that is supplied into and discharged from said head housing,
  said plate holding portion comprises:
  a slide guide member provided in head housing and extending in the same direction of said surface to be polished;
  a slide member provide on said slide guide member so as to be capable of reciprocating motion in the same direction of said surface to be polished; and
  a sing holding member provided on said slide member for holding said polishing member swingably.

2. The polishing apparatus according to claim 1, characterized in that a swing buffering mechanism of said polishing member is provided astride said polishing member and said slide member.

3. The polishing apparatus according to claim 2, characterized in that a biasing spring is provided in said swing buffering mechanism for urging said polishing member into a position facing said surface to be polished.

4. A polishing apparatus comprising a subject holder for holding a polishing subject and a polishing head having a polishing member provided with a polishing surface on a surface thereof which faces a surface to be polished of said polishing subject, said polishing apparatus being constituted to perform polishing of said surface to be polished by moving said polishing surface relative to said surface to be polished while said polishing surface is in contact with said surface to be polished,
  characterized in that said polishing head comprises a head housing having an opening in a surface thereof which faces said surface to be polished, and a plate holding portion provided in said head housing for holding said polishing member,
  said polishing member is provided in said head housing so as to block said opening, and constituted to be capable of a reciprocating motion in the direction of said surface to be polished using air that is supplied into and discharged from said head housing,
  said plate holding portion comprises:
  a slide guide member provided in said head housing and extending in the same direction of said surface to be polished;
  a slide member provided on said slide guide member so as to be capable of a reciprocating motion in the same direction of said surface to be polished; and
  a swing holding member provided on said slide member for holding said polishing member swingably,
  characterized in that an intake port for supplying air into said head housing is provided in said head housing, and an exhaust port for discharging air from said head housing is provided in said head housing separately from said intake port.

5. The polishing apparatus according to claim 4, characterized by further comprising:
  an air supply pipe provided such that one end thereof is connected to said intake port;
  an air supply portion connected to the other end of said air supply pipe, which is capable of supplying air into said head housing via said air supply pipe and said intake port;
  an exhaust pipe provided such that one end thereof is connected to said exhaust port; an air discharging portion connected to the other end of said exhaust pipe, which is capable of discharging air from said head housing via said exhaust port and said exhaust pipe; and an air pressure control portion for controlling operations of said air supply portion and said air discharging portion so that the air pressure in said head housing matches a desired air pressure.

6. The polishing apparatus according to claim 5, characterized by further comprising a supply side pressure measuring portion which is capable of measuring the air pressure in said air supply pipe, and an exhaust side pressure measuring portion which is capable of measuring the air pressure in said exhaust pipe, and characterized in that said air pressure control portion measures the air pressure in said head housing on the basis of the air pressure in said air supply pipe, measured by said supply side pressure measuring portion, and the air pressure in said exhaust pipe, measured by said exhaust side pressure measuring portion, and controls operations of said air supply portion and said air discharging portion such that said measured air pressure in said head housing matches said desired air pressure.

7. A polishing apparatus comprising a subject holder for holding a polishing subject and a polishing head having a polishing member provided with a polishing surface on a surface thereof which faces a surface to be polished of said polishing subject, said polishing apparatus being constituted to perform polishing of said surface to be polished by moving said polishing surface relative to said surface to be polished while said polishing surface is in contact with said surface to be polished, characterized in that said polishing head comprises a head housing having an opening in a surface thereof which faces said surface to be polished, and a ring member provided in an inside portion of said head housing, said polishing member is provided in said head housing so as to block said opening, and constituted to be capable of a reciprocating motion in the direction of said surface to be polished using air that is supplied into and discharged from said head housing, said ring member is formed to surround the periphery of said polishing member positioned within said head housing such that a predetermined clearance is formed between said ring member and an outer peripheral portion of said polishing member, and characterized in that an intake port for supplying air into said head housing is provided in said head housing, and an exhaust port for discharging air from said head housing is provided in said head housing separately from said intake port.

8. The polishing apparatus according to claim 7, characterized in that a plate holding portion for holding said polishing member is provided in said head housing, and said plate holding portion comprises:

a slide guide member provided in said head housing and extending in the direction of said surface to be polished;

a slide member provided on said slide guide member so as to be capable of a reciprocating motion in the direction of said surface to be polished; and a swing holding member provided on said slide member for holding said polishing member swingably.

9. The polishing apparatus according to claim 8, characterized in that a swing buffering mechanism of said polishing member is provided astride said polishing member and said slide member.

10. The polishing apparatus according to claim 9, characterized in that a biasing spring is provided in said swing buffering mechanism for urging said polishing member into a position facing said surface to be polished.

11. The polishing apparatus according to claim 7, characterized by further comprising:

an air supply pipe provided such that one end thereof is connected to said intake port; an air supply portion connected to the other end of said air supply pipe, which is capable of supplying air into said head housing via said air supply pipe and said intake port;

an exhaust pipe provided such that one end thereof is connected to said exhaust port;

an air discharging portion connected to the other end of said exhaust pipe, which is capable of discharging air from said head housing via said exhaust port and said exhaust pipe; and an air pressure control portion for controlling operations of said air supply portion and said air discharging portion so that the air pressure in said head housing matches a desired air pressure.

12. The polishing apparatus according to claim 11, characterized by further comprising a supply side pressure measuring portion which is capable of measuring the air pressure in said air supply pipe, and an exhaust side pressure measuring portion which is capable of measuring the air pressure in said exhaust pipe, and characterized in that said air pressure control portion measures the air pressure in said head housing on the basis of the air pressure in said air supply pipe, measured by said supply side pressure measuring portion, and the air pressure in said exhaust pipe, measured by said exhaust side pressure measuring portion, and controls operations of said air supply portion and said air discharging portion such that said measured air pressure in said head housing matches said desired air pressure.

13. A polishing apparatus comprising a subject holder for holding a polishing subject and a polishing head having a polishing member provided with a polishing surface on a surface thereof which faces a surface to be polished of said polishing subject, said polishing apparatus being constituted to perform polishing of said surface to be polished by moving said polishing surface relative to said surface to be polished while said polishing surface is in contact with said surface to be polished, characterized in that said polishing head comprises a head housing having an opening in a surface thereof which faces said surface to be polished, and a plate holding portion provided in said head housing for holding said polishing member, said polishing member is provided in said head housing so as to block said opening, and constituted to be capable of a reciprocating motion in the direction of said surface to be polished using air that is supplied into and discharged from said head housing, a ring member provided in an inside portion of said head housing, said ring member is formed to surround the periphery of said polishing member positioned within said head housing such that a predetermined clearance is formed between said ring member and an outer peripheral portion of said polishing member, in a radial direction of the ring member, said plate holding comprises moving means for causing said polishing member to perform a reciprocating motion in the same direction of said surface to be polished, and swing holding means provided on said moving means for holding said polishing member swingably.

* * * * *